United States Patent [19]
Matsuzaki

[11] Patent Number: 5,956,290
[45] Date of Patent: Sep. 21, 1999

[54] DLL CIRCUIT AND A MEMORY DEVICE BUILDING THE SAME IN

[75] Inventor: Yasurou Matsuzaki, Kawasaki, Japan

[73] Assignee: Fujitsu Limited, Kawasaki, Japan

[21] Appl. No.: 09/100,036

[22] Filed: Jun. 19, 1998

[30] Foreign Application Priority Data

Jan. 16, 1998 [JP] Japan .................................. 10-006220

[51] Int. Cl.⁶ .................................................. G11C 8/00
[52] U.S. Cl. ........................... 365/233; 365/194; 365/157; 365/158
[58] Field of Search .................................. 365/233, 194; 327/156, 157, 158, 149

[56] References Cited

U.S. PATENT DOCUMENTS

| | | | |
|---|---|---|---|
| 5,402,389 | 3/1995 | Flannagan et al. | 365/233 |
| 5,550,514 | 8/1996 | Liedberg | 327/158 |
| 5,581,512 | 12/1996 | Kitamura | 365/233 |
| 5,796,673 | 8/1998 | Foss et al. | 365/233 |
| 5,825,226 | 10/1998 | Ferraiolo et al. | 327/158 |

OTHER PUBLICATIONS

SP23.4: A 2.5ns Clock Access 250 MHz 256Mb SDRAM with a Synchronous Mirror Delay, SAEKI et al., *IEEE International Solid–State Circuits Conference*, Feb. 10, 1996, pp. 374–375.

*Primary Examiner*—Son T. Dinh
*Attorney, Agent, or Firm*—Nikaido, Marmelstein, Murray & Oram LLP

[57] ABSTRACT

A non-loop type DLL circuit which makes it possible to lock in at accurate timing for a short time and a memory device in which the DLL circuit is built in. The above-described clock cycle measurement section measures a clock cycle of a reference clock plural times and generates a delay control signal according to the coincident result while the plural measurements. The variable delay circuit is supplied with a reference clock or an internal clock (first clock) maintaining the same clock cycle delayed by a prescribed phase from the reference clock, and its delay time is controlled according to the delay control signal so that it generates at an output terminal an output clock (second clock) in synchronism with the reference clock and maintains a prescribed phase relationship with the reference clock.

6 Claims, 12 Drawing Sheets

DLL CIRCUIT

REFERENCE AND GENERATED CLOCKS IN DLL CIRCUIT

TO VARIABLE DELAY CIRCUIT 14

FIG.8 CLOCK CYCLE MEASUREMENT SECTION IN THE OTHER EMBODIMENT

A CASE WHERE RESULTS ARE NOT COINCIDENT ON THE THIRD MEASUREMENT

READING OUT INFORMATION OF N217, N227, N237...

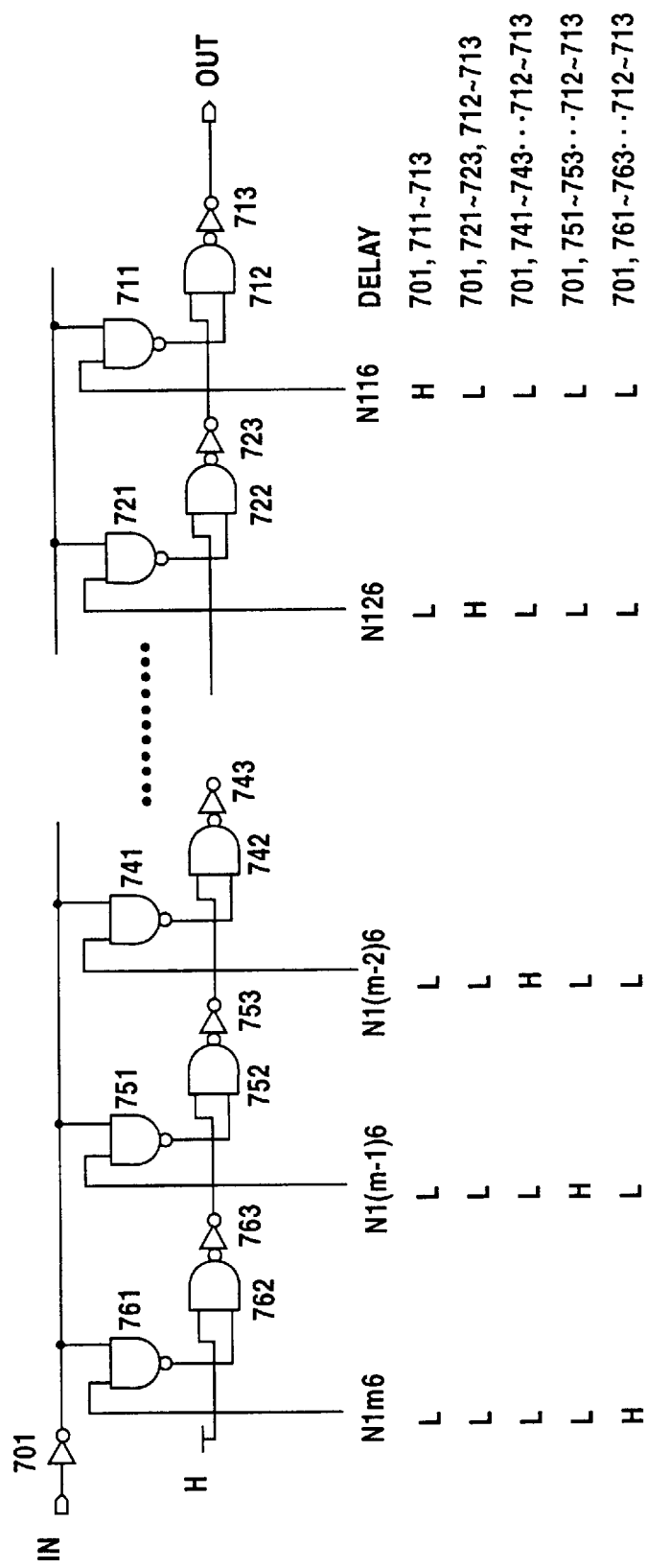

DLL CIRCUIT AND A MEMORY DEVICE BUILDING THE SAME IN

BACKGROUND OF THE INVENTION

1. Field of the Invention

The present invention relates to a DLL (Delay Locked Loop) circuit which generates an output clock synchronized with a reference clock and maintaining a phase relationship to the reference clock. More particularly, it relates to a DLL circuit which makes it possible to accurately generate an output clock for a short time even if the reference clock is changed by noise occurrence, and a memory device in which the DLL circuit is built.

2. Description of the Related Art

A PLL or DLL circuit is used as a self-timing control circuit (STC) which generates an internal clock in synchronism with an external reference clock, for example. This DLL circuit is well-known as a circuit which generates an output clock synchronized with a reference clock supplied from the external device and maintaining the prescribed phase relationship as usual.

In recent years, in a synchronous memory device, such as a synchronous DRAM (SDRAM) which performs high-speed operations, the DLL circuit is provided inside, and an internal clock which maintains the prescribed phase relation ship in synchronism with a reference clock supplied from a memory controller side, for example, an internal clock synchronized by a same phase or a prescribed angle from the reference clock is generated. The internal clock is employed to control the timing of reading out an output, thereby controlling the timing of reading out an output at the reference clock supplied by the memory controller side and making the high-speed operations in the SDRAM possible.

A loop type of DLL circuit comprising a variable delay circuit which generates a delay clock by giving a delay to a reference clock, a phase comparator which detects a phase difference between the reference clock and the delay clock, and a delay control circuit which generates a delay control signal such that there is no phase difference between the two supplied clocks.

This DLL circuit is controlled so as to keep the locked status where there is no phase difference with the reference and delay clocks. Therefore, even if some small changes occur on the reference clock by noises, a clock which is phase synchronized to the reference clock supplied for a prescribed long period can be generated. However, the delay control signal is generated, judging whether or not the phases are coincident every time a reference clock is supplied, and therefore, it takes long time to achieve to the locked status.

On the other hand, another DLL circuit is an non-loop type DLL circuit comprising a variable delay circuit which generates an targeted output clock by giving a delay to a reference clock and a clock cycle measurement section which generates a delay control signal suitable to the length of clock cycle. This circuit does not require long time to achieve to the locked status, not similarly to the above-described loop type DLL circuit.

However, since a non-loop type DLL circuit measures a clock cycle of reference clock supplied actually, if the reference clock is changed by an unexpectedly generated noise when measuring the cycle, and a clock cycle different from a normal cycle is detected, a delay control signals may be generated according to the wrong clock cycle. It is general to perform clock cycle measurement operations on this DLL circuit in every cycles of a plurality of reference clocks. Therefore, if a delay control signal according to the wrong clock cycle is generated, an output clock will be generated at the wrong timing until coming to the subsequent clock cycle measurement.

SUMMARY OF THE INVENTION

Accordingly, it is an object of the present invention to provide a non-loop type DLL circuit which measures a clock cycle of a reference clock and can generate a delay control signal according to an accurate clock cycle measurement.

It is another object of the present invention to provide a DLL circuit which generates a delay control signal for a locked status in a short time and can generate an output clock in which errors are minimized.

It is still another object of the present invention to provide a memory device in which the above-described DLL circuit is employed.

To achieve the aforementioned objects, the DLL circuit according to the present invention comprises: a clock cycle measurement section which measures a clock cycle of a reference clock; and a variable delay circuit of which delay time is controlled by a delay control signal. The above-described clock cycle measurement section measures a clock cycle of the reference clock plural times and generates a delay control signal according to the coincident result while the plural measurements. The variable delay circuit is supplied with a reference clock or an internal clock (first clock) having the same clock cycle delayed by a prescribed phase from the reference clock, and its delay time is controlled according to the delay control signal so that it generates at an output terminal an output clock (second clock) in synchronism with the reference clock and maintaining a prescribed phase relationship with the reference clock.

The above-described DLL circuit according to the present invention does not generate a delay control signal according to only one measurement of a clock cycle of the reference clock, but generates a delay control signal according to a measured clock cycle when the several measurements of the clock cycle of reference clock are executed and the measured results are coincident. Therefore, the DLL circuit according to the present invention makes it possible to generate a delay control signal with minimized errors in a short time.

The above-mentioned clock cycle measurement section includes: a delay measurement circuit to which a start pulse in synchronism with a timing of starting the first clock is supplied; a delay status latching section which latches a delay status of the delay measurement circuit in response to an end pulse in synchronism with a timing of finishing the first clock; a delay measured result latching section which maintains the delay measured result latched by the delay status latching section; and a coincidence judging section which judges whether or not the delay measured result stored in the delay measured result latching section is coincident with the currently measured result. The delay control signal is latched to the variable delay pointer according to the coincident result obtained by the coincidence judging section.

Additionally, the other DLL circuit according to the present invention executes a clock cycle measurement of a reference clock several attempts, generates a delay control signal according to the clock cycle when the measured results are coincident and generates a delay control signal according to the last measured cycle when the measured results are not coincident even after a prescribed number of measurements are executed. An output clock which maintains a prescribed phase relationship with the reference clock is generated by the variable delay circuit in response to the delay control signal.

According to the present invention, it becomes possible to limit the time for generating the delay control signal and generate more precise delay control signal in the limited short time.

Further, the other DLL circuit according to the present invention executes clock cycle measurements of a reference clock several attempts, similarly to the above-described DLL circuit, generates a delay control signal according to the cycle when the measured results are coincident, and generates the delay control signal according to an intermediate value of the measured results when the results are not coincident even after the several measurements are executed. An output clock which maintains a prescribed phase relationship with a reference clock is generated by a variable delay circuit in response to the delay control signal.

According to the present invention, it becomes possible to limit the time required for generating a delay control signal and generate more precise delay control signal in the limited short time.

BRIEF DESCRIPTION OF THE DRAWINGS

FIG. 11 is a detailed circuitry diagram of a variable delay circuit 14 in FIG. 1.

DESCRIPTION OF THE PREFERRED EMBODIMENTS

Embodiments according to the present invention will be now explained in accompanying with the attached drawings. However, the technical scope of this invention is not restricted by those embodiments.

Figure 1:
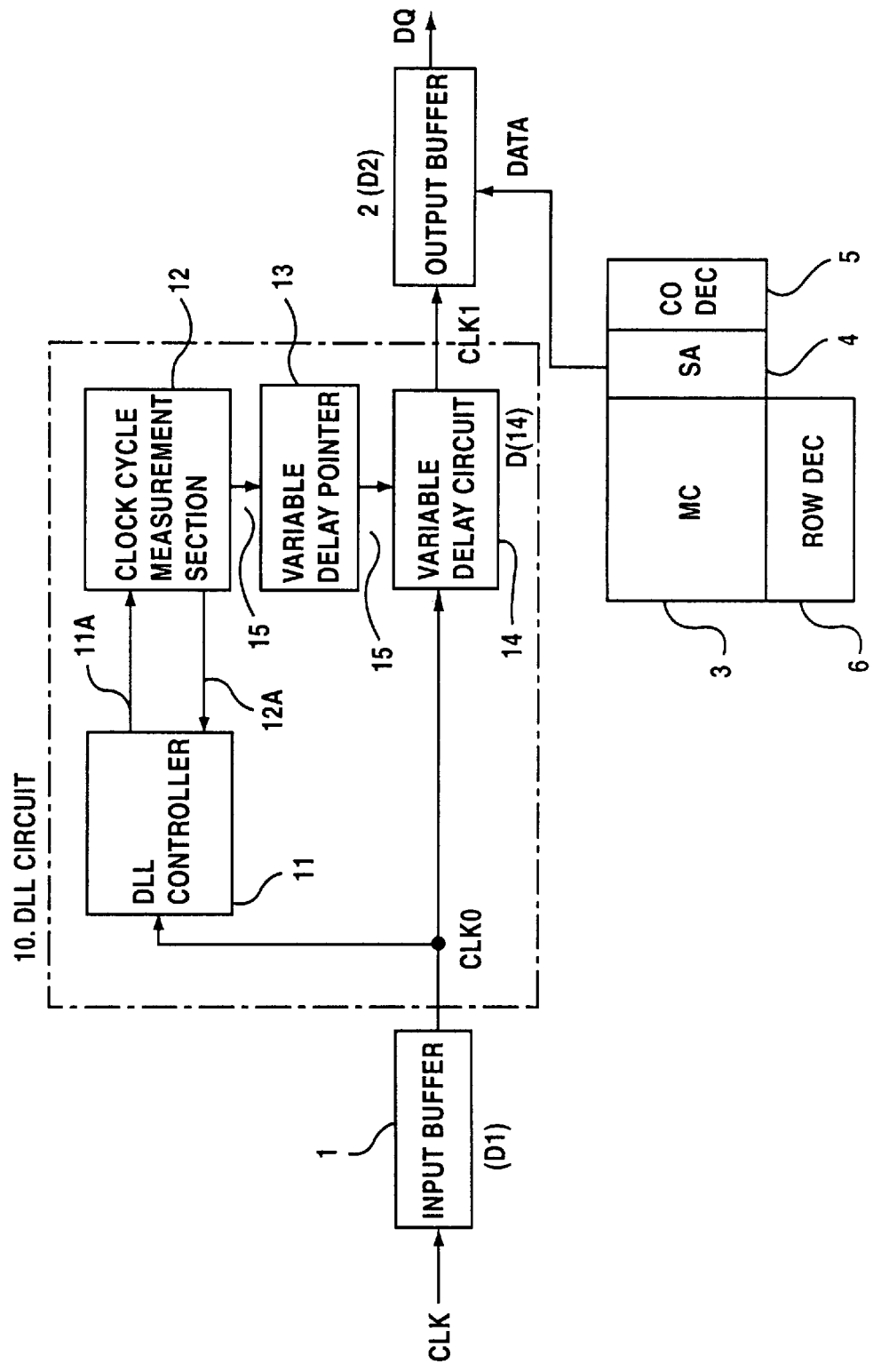
FIG. 1 is a structural diagram of a DLL circuit according to the present invention.

FIG. 1 is a structural diagram of a DLL circuit according to the present invention. In the example of FIG. 1, a DLL circuit 10 is built in a memory device comprising a memory cell array 3, a sense amplifier 4, a column decoder 5, and a row decoder 6. The DLL circuit 10 generates an output clock CLK1 which controls the timing for outputting read out data in an output buffer 2. A reference clock CLK is supplied to an input buffer 1, and an internal clock CLK0 which is delayed by a delay time (D1) in the input buffer 1 is supplied to the DLL circuit 10.

The DLL circuit 10 comprises a DLL controller 11, a clock cycle measurement section 12, a variable delay pointer 3 and a variable delay circuit 14. The DLL controller 11 to which the internal clock CLK0 is supplied generates a control pulse 11A. The clock cycle measurement section 12 measures a clock cycle of reference clock CLK in response to the control pulse 11A generated by the controller 11. The variable delay pointer 13 latches a delay control signal 15 generated according to the cycle measured by the measurement section 12. A delay time of the variable delay circuit 14 is controlled according to the delay control signal 15. The variable delay circuit 14 to which the internal clock CLK0 is supplied supplies the delay according to the delay control signal 15 to the internal clock CLK0 and outputs the output clock CLK1 having a prescribed phase relationship with the reference clock CLK. The output clock CLK1 is supplied to an output buffer 2 in order to control the timing of an output DQ of read out data DATA.

Figure 2:
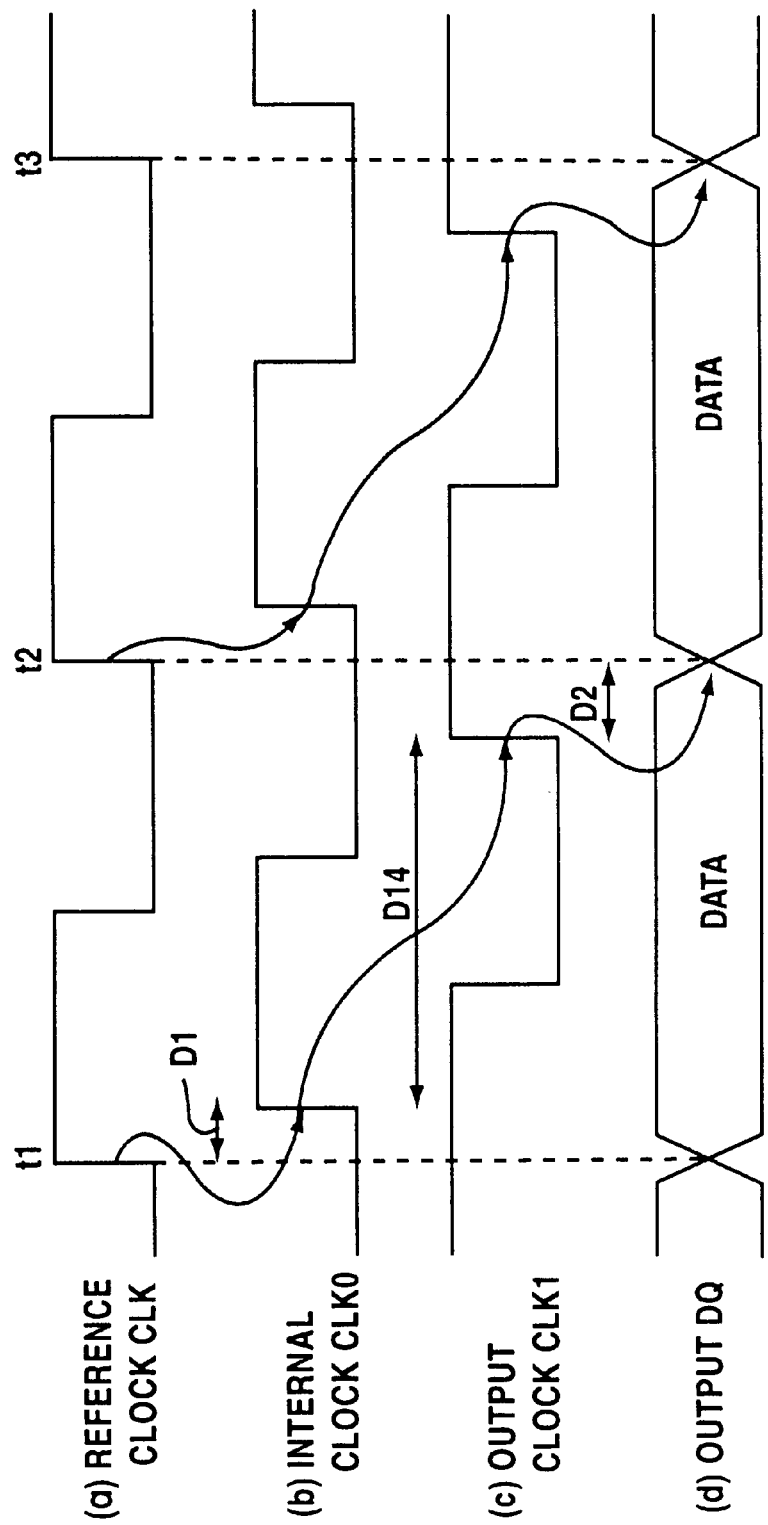
FIG. 2 is a timing chart for showing a relationship between a reference clock CLK and the generated clock CLK1 in a DLL circuit.

FIG. 2 is a timing chart for showing a relationship between a reference clock CLK and a clock CLK1 generated by a DLL circuit 10. The reference clock CLK rises at time t1, t2 or t3 and starts its clock cycle at each time t1, t2 or t3. An output terminal DQ in the memory device outputs the read out data DATA which is phase synchronized with the timing t1, t2 or t3 at each rising edge of the reference clock CLK. Therefore, the variable delay circuit 14 in the DLL circuit 10 generates a delay time D14 obtained by eliminating a delay time D1 in an input buffer 1 and a delay time D2 in an output buffer 2 from a length of the clock cycle of the reference clock CLK. As a result, as shown in FIG. 2, the input buffer 1 generates an internal clock CLK0 delayed by a delay time D1 from the reference clock CLK. Further, the variable delay circuit 14 to which an internal clock CLK0 is supplied generates an output clock CLK1 which rises after an elapse of a delay time D14 with respect to the internal clock CLK0. Then, the output buffer 2 outputs the read out data DATA in response to the output clock CLK1 to an output terminal DQ after an elapse of the delay time D2.

As is apparent from the timing chart shown in FIG. 2, the DLL circuit 10 measures a clock cycle of the inner clock CLK0 which is the same as that of the reference clock CLK and generates a delay control signal 15. By using the signal 15, the delay time D14 obtained by eliminating the delay times D1 and D2 of the input and output buffers 1 and 2 from the measured clock cycle can be generated. As a result, the output buffer 2 of a memory device can output an output DQ at the timing perfectly phase synchronized with the reference clock CLK.

A clock cycle of a reference clock measured by a DLL circuit 10 is not limited to one clock cycle. For example, it is also possible that a clock cycle can be measured several times to control the timing of the output DQ delayed by the several clock cycles. Additionally, it is possible to output the output DQ which is synchronized with the reference clock CLK and maintains a prescribed phase difference with respect to the reference clock CLK, by adding an element for delaying an output of the input buffer 1 by a prescribed angle from the reference clock CLK.

Figure 3:
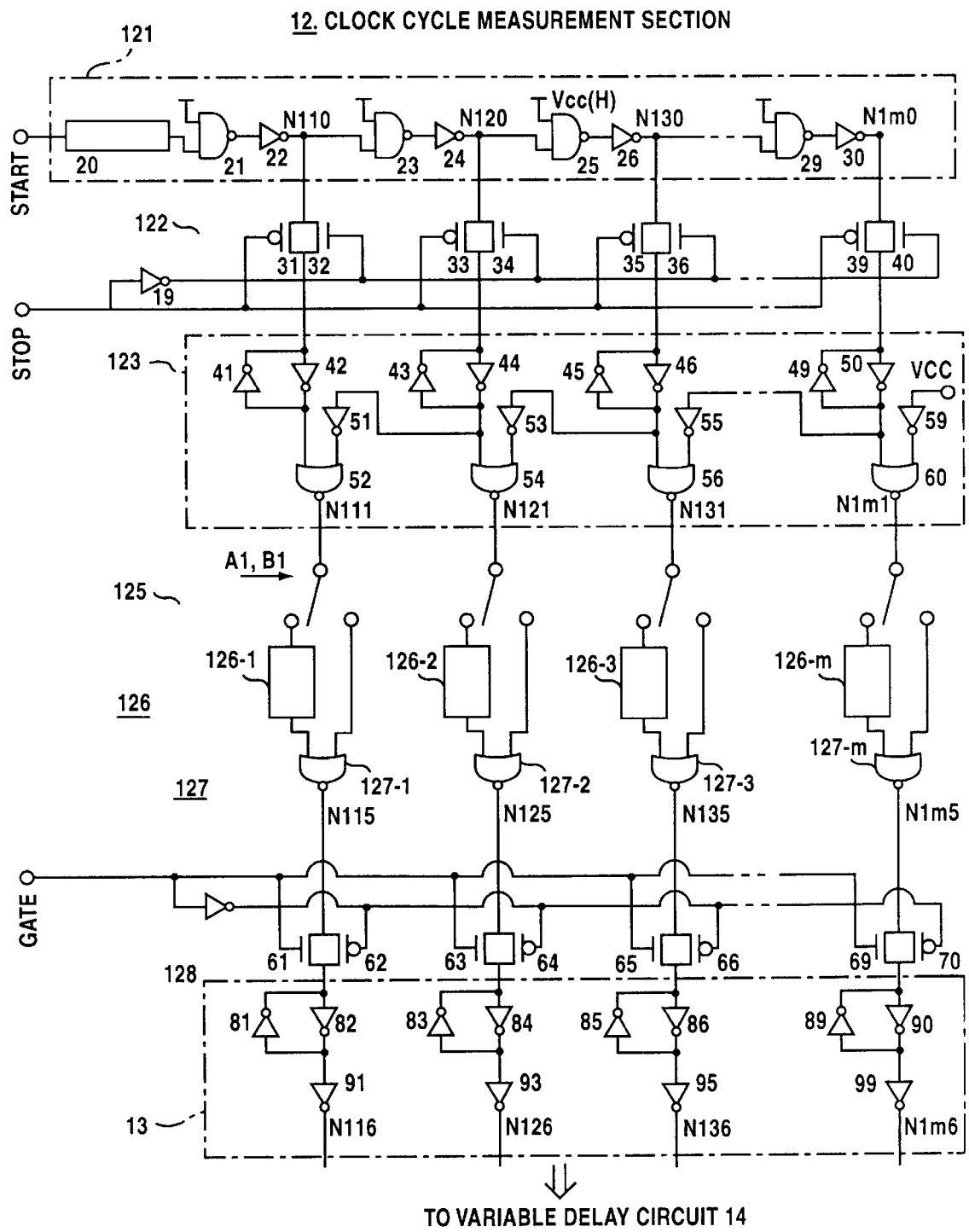
FIG. 3 is a brief circuit diagram of a clock cycle measurement section and a variable delay pointer of a DLL circuit.

FIG. 3 is a brief circuit diagram of a clock cycle measurement section 12 and a variable delay pointer 13 of a DLL circuit. In the lower section of FIG. 3, a variable delay pointer 13 is provided, and the clock cycle measurement section 12 is formed of the other elements shown in FIG. 3. The clock cycle measurement section 12 is supplied with a start pulse START, a stop pulse STOP and a gate pulse GATE as a control pulse 11A from the DLL controller 12 as shown in FIG. 1.

Additionally, the clock cycle measurement section 12 comprises a delay measurement circuit 121, a gate section 122, a delay status latching section 123, a delay measured result latching section 126, and a coincidence judging circuit 127. A start pulse START of which phase is coincident with a rising edge of the reference clock CLK or the internal clock CLK0 is supplied to the delay measurement circuit 121. The gate section 122 opens in response to the stop pulse STOP which rises at a rising edge after an elapse of one clock cycle of the start pulse START. The delay status latching section 123 temporally latches the delay status in the delay measurement section 121. The latching section 126 latches the latched delay measured result. The coincidence judging circuit 127 judges whether or not the previously measured result is coincident with the currently measured result. A switch 125 supplies information latched in the latching section 123 to the coincidence judging circuit 127 and the latching section 126 according to each control pulses A1 and B1.

The clock cycle measurement section 12 further includes a gate section 128. The gate 128 opens in response to a gate pulse GATE generated when the coincidence judging section 127 detects a coincidence between the above-described measurement results. The delay control signal when the measured results are coincident is latched to the variable delay pointer 13 through the gate section 128. Nodes N115–N1m5 are corresponding to the delay control signal 15.

The delay measurement circuit 121 is formed of a basic delay circuit 20 and a variable delay circuit formed of NAND gates 21, 23, 25, . . . , 29 and inverters 22, 24, 26, . . . , 30. A start pulse START having a short pulse width in synchronism with the rise timing of an internal clock CLK0 propagates the basic delay circuit 20 and the variable delay circuit, and then, makes nodes N110, N120 and N130 level H in order. Then, the gate section 122 closes in response to a stop pulse STOP having a short pulse width in synchronism with the next rise timing of the internal clock CLK0. The gate section 122 is formed of a CMOS transfer gate having P channel transistors 31, 33, 35, . . . , 39 and N channel transistors 32, 34, 36, . . . , 40. Therefore, one node being at level H selected from nodes N110, N120, N130, . . . , N1m1, which positions according to a clock cycle of the internal clock CLK0, and the other nodes being at level L are latched in the delay status latching section 123 in response to the stop pulse STOP. The delay status latching section 123 including a latch circuit formed of inverters 41–50, inverters 51–59, and NOR gates 52–60 makes one output N111, N121, N131, . . . , N1m1 from a NOR gate, which corresponds to the most right node of latching level H, level H.

A delay time of the above-described basic delay circuit 20 is formed so as to correspond to a delay time D2 of an output buffer 2, for example. Thereby, the delay time of the variable delay circuit of gates 21 to 30 is corresponding to the delay time D14 of the variable delay circuit 14.

The switch 125 supplies each signal from node N111–N1m1 to each NOR gate 127-1–127-m at first. Then, it judges whether or not the currently measured result is coincident with the result stored in the latch section 126-1 to 126-m. When the both results are not coincident, the switch 125 supplies each signal of node N111–N1m1 to the latch section 126. In other words, one of the nodes N111 to N1m5 is at level H according to the length of clock cycle of the internal clock CLK0, and the signal is subsequently supplied to the latch section 126. When the same node becomes level H again after that, a NOR gate 127-1 to 127-m in the coincidence judging circuit 127 corresponding to the node makes one of nodes N115 to N1m5 level H.

If the circuit 127 detects the coincidence, a coincidence detecting signal, not shown in FIG. 3, is generated, the DLL controller 11 outputs a gate pulse GATE in response to this signal, and CMOS transfer gates 61–70 in the gate section 128 open. As a result, the variable delay pointer 13 latches the delay control signal 15 which is output to each node N115–N1m5. The variable delay pointer 13 includes a latch circuit formed of inverters 81–90 and inverters 91–99. One of the nodes N115 to N1m5 corresponding to the node of which level is coincident becomes level H, and the other nodes are all level L. This control signal 15 is supplied from the node N116–N1m6 to the variable delay circuit 14. The detail explanation of the variable delay circuit 14 will be described later.

Figure 4:
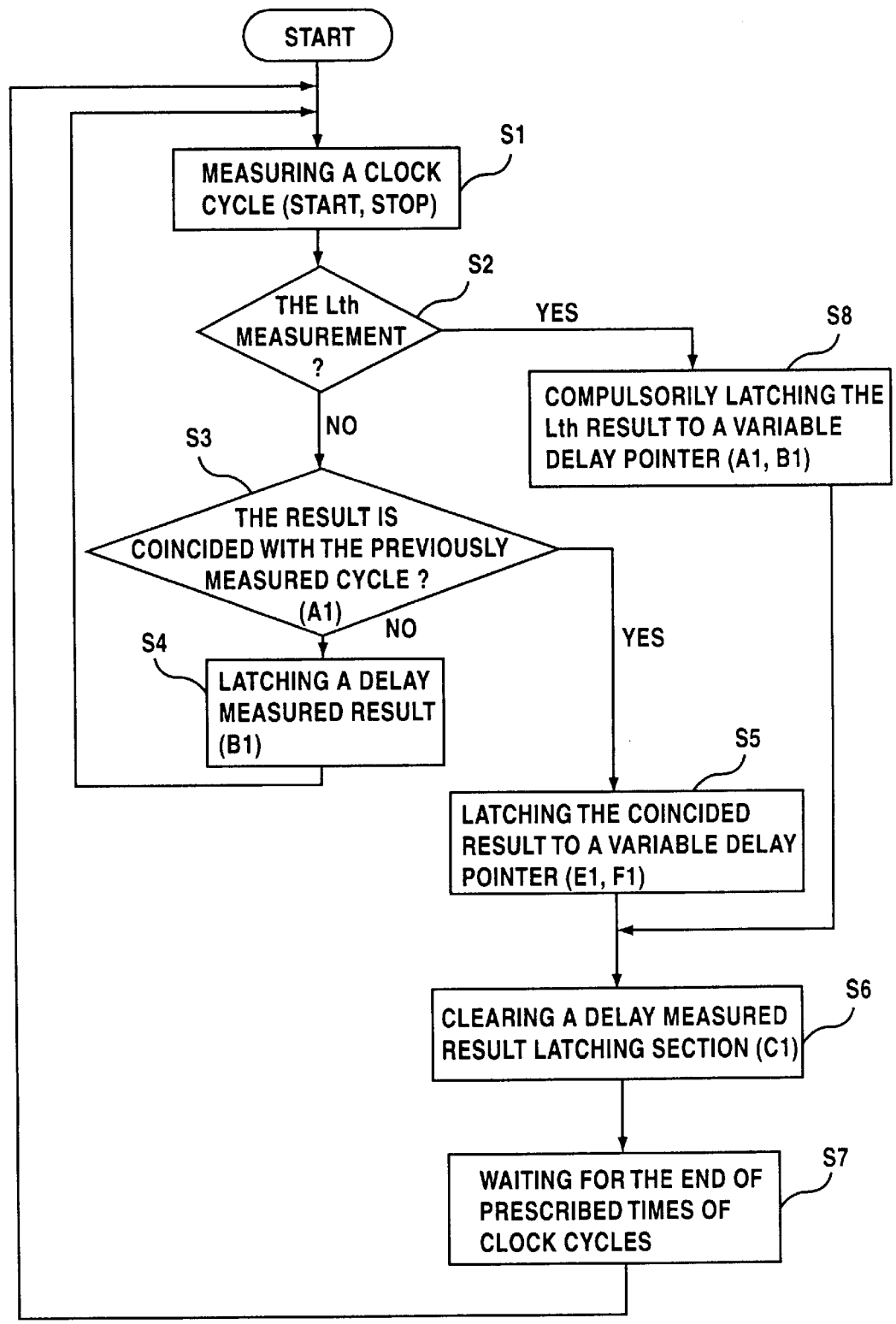
FIG. 4 is an operational flow chart of DLL circuit employing a clock cycle measurement section 12 illustrated in FIG. 3.

FIG. 4 is an operational flowing chart of a DLL circuit employing a clock cycle measurement section 12 illustrated in FIG. 3. As described above, the DLL controller 11 supplies a start pulse START in synchronism with the rise of an internal clock CLK0 and a stop pulse STOP in synchronism with the next rise of internal clock CLK0 to a clock cycle measurement section 12. Then the measurement section 12 measures the clock cycle (S1). In this example, if the coincidence can not be obtained by measuring for L times, the Lth result being the last result is compulsorily employed. Therefore, the first measurement is not achieved to the Lth measurement (S2), the coincidence judging circuit 127 judges whether or not the result is coincident with the previously measured result in response to the pulse A1 (S3). If there is no coincidence, the measured result is latched to the delay measured result latching section 126 in response to the pulse B1 (S4). Then, the clock cycle measurement section 12 measures the clock cycle again (S1).

If the previously measured result is coincident with the currently measured result while measuring for L times (S3), the variable delay pointer 13 latches the measured result in response to the gate pulse GATE (F1) (S5). This result becomes the delay control signal 15 as it is, as described above. Then, the latched status of the latch section 123 is cleared according to a pulse C1, not shown in FIG. 3 (S6). The DLL circuit 10 waits for the end of prescribed times of clock cycle (S7). While the DLL circuit 10 waits, the delay time of the variable delay circuit 14 is controlled according to the delay control signal 15 latched by the variable delay pointer 13.

When the result is not coincident with the previously measured result even after finishing the Lth measurement, the last Lth measured result is compulsorily latched to the variable delay pointer 13 (S8). The compulsorily latch can be executed by concurrently supplying the signal of the node N111–N1m1 to the latch section 126 and the coincidence judging section 127 according to the concurrently generated pulses A1 and B1, as described later.

As described above, in the DLL circuit employing the clock cycle measurement section 12 illustrated in FIG. 3, after a clock cycle is measured several times and the same results can be obtained, at least, two times, a delay control signal according to the result is generated. Then, the output clock CLK1 is generated according to the delay time D14 of the variable delay circuit 14 controlled by the delay control signal 15. Therefore, the DLL circuit can generate a delay control signal 15 according to the more precise measured result of a clock cycle, even if it is for a short interval. When the results are not coincident by measuring for the prescribed times, i.e., L times, the last result is employed to generate the delay control signal 15.

Figures 5, 5A:
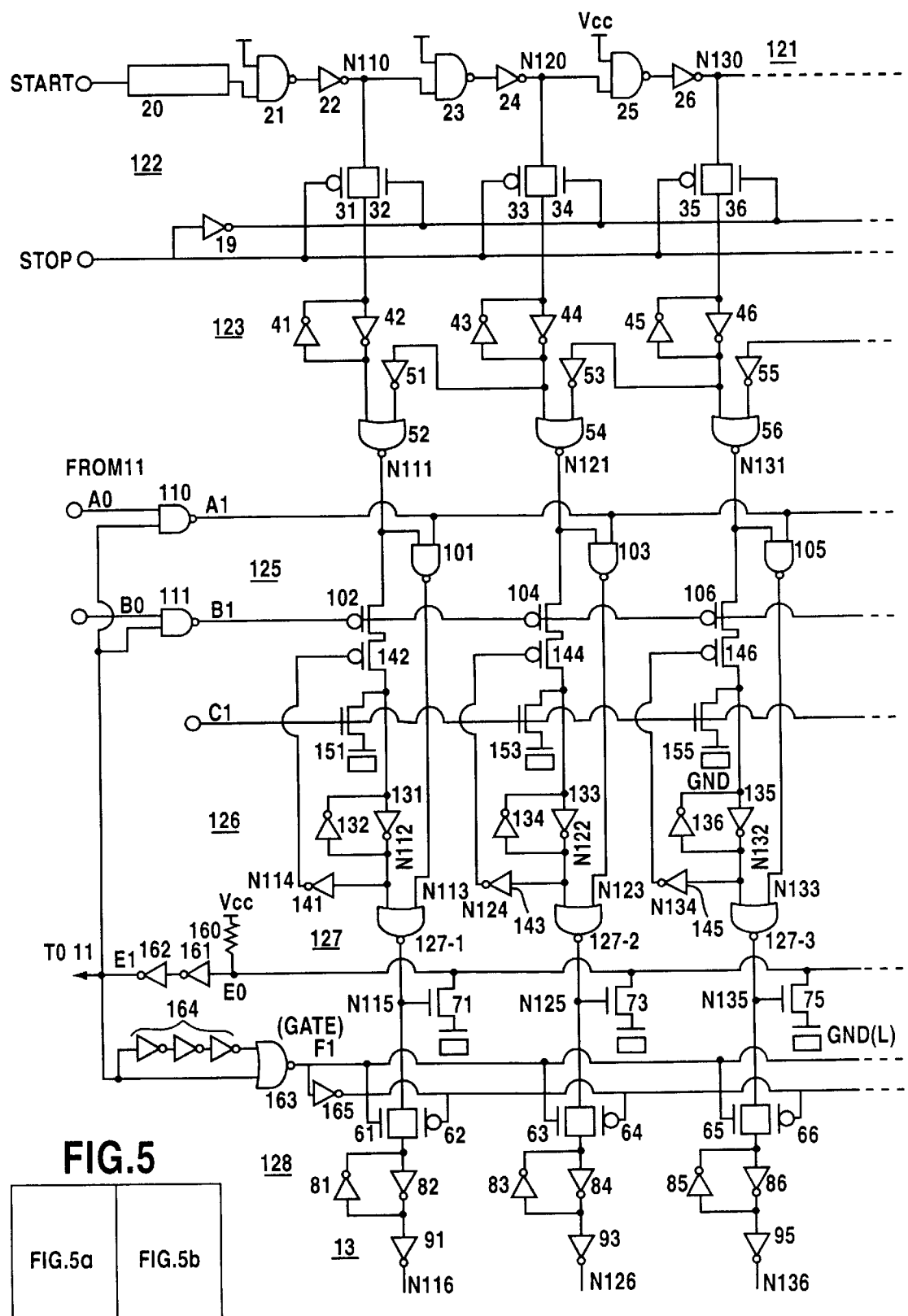
FIG. 5 is a detailed circuit of a clock cycle measurement section illustrated in FIG. 3.
Figure 5B:
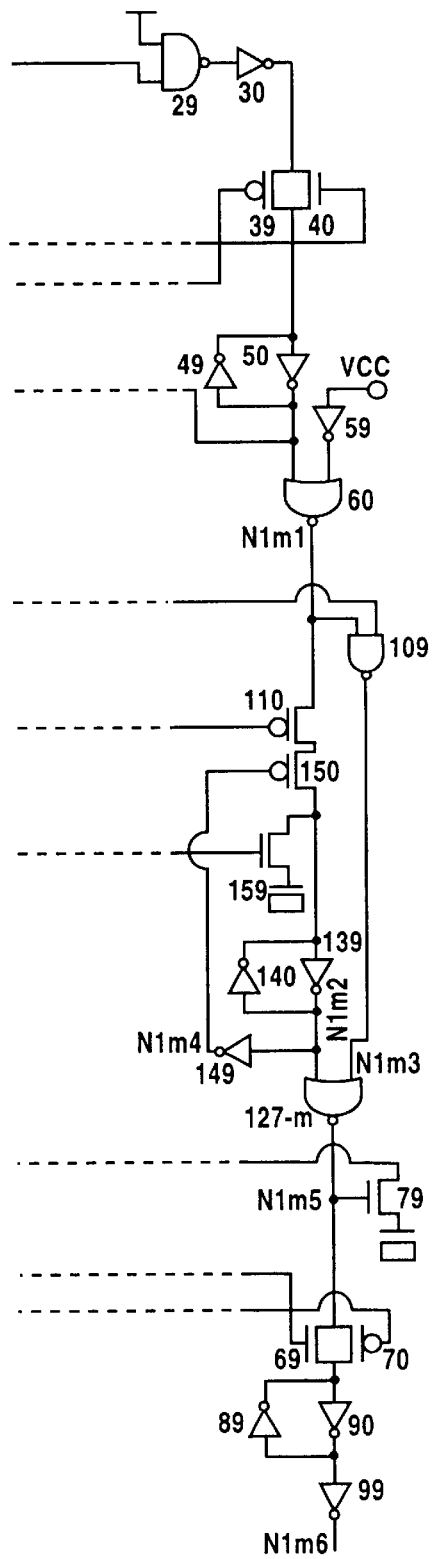

FIG. 5 is a detailed circuitry diagram of a clock cycle measurement section in FIG. 3. Same numerals and symbols are used to denote and identify corresponding components shown in FIG. 3. A more detailed circuitry diagram of a switch section 125 and a delay measured result latching section 126 is additionally illustrated in FIG. 5. Further, in FIG. 5, a gate pulse GATE is shown as a pulse F1, and the pulse F1 is also generated according to a coincidence judging signal E1.

A switch section 125 is formed of NAND gates 101, 103, 105, . . . , 109 each of which open or close operation is controlled by a pulse A1, and P channel transistors 102, 104, 106, . . . , 110 controlled by a pulse B1. The delay measured result latching section 126 includes a latch circuit formed of inverters 131–140, inverters 141, 143, 145, . . . , 149 for inverting nodes N112–N1m2 of each latch circuits, and P channel transistors 142, 144, 146, . . . , 150 controlled by these inverters. When H level at the node N111–N1m1 is hold in the latch circuit of the delay detection latch circuit 126, the corresponding one of the transistors 142, 144, 145, . . . , 150 becomes non-conductive, and therefore, the result after that is not taken in the latch circuit 126. N channel transistors 151 to 159 which are controlled by a pulse C1 clear its latch status.

A coincidence judging section 127 includes NOR gates 127-1 to 127-m for coincidence detection and further includes N channel transistors 71–79, a resistor 160, and inverters 161, 162. These elements make one of the transistors 71–79 conductive when judging the coincidence and generate a coincidence judging signal E1. The coincidence judging signal E1 is also supplied to the DLL controller 11.

Figure 6:
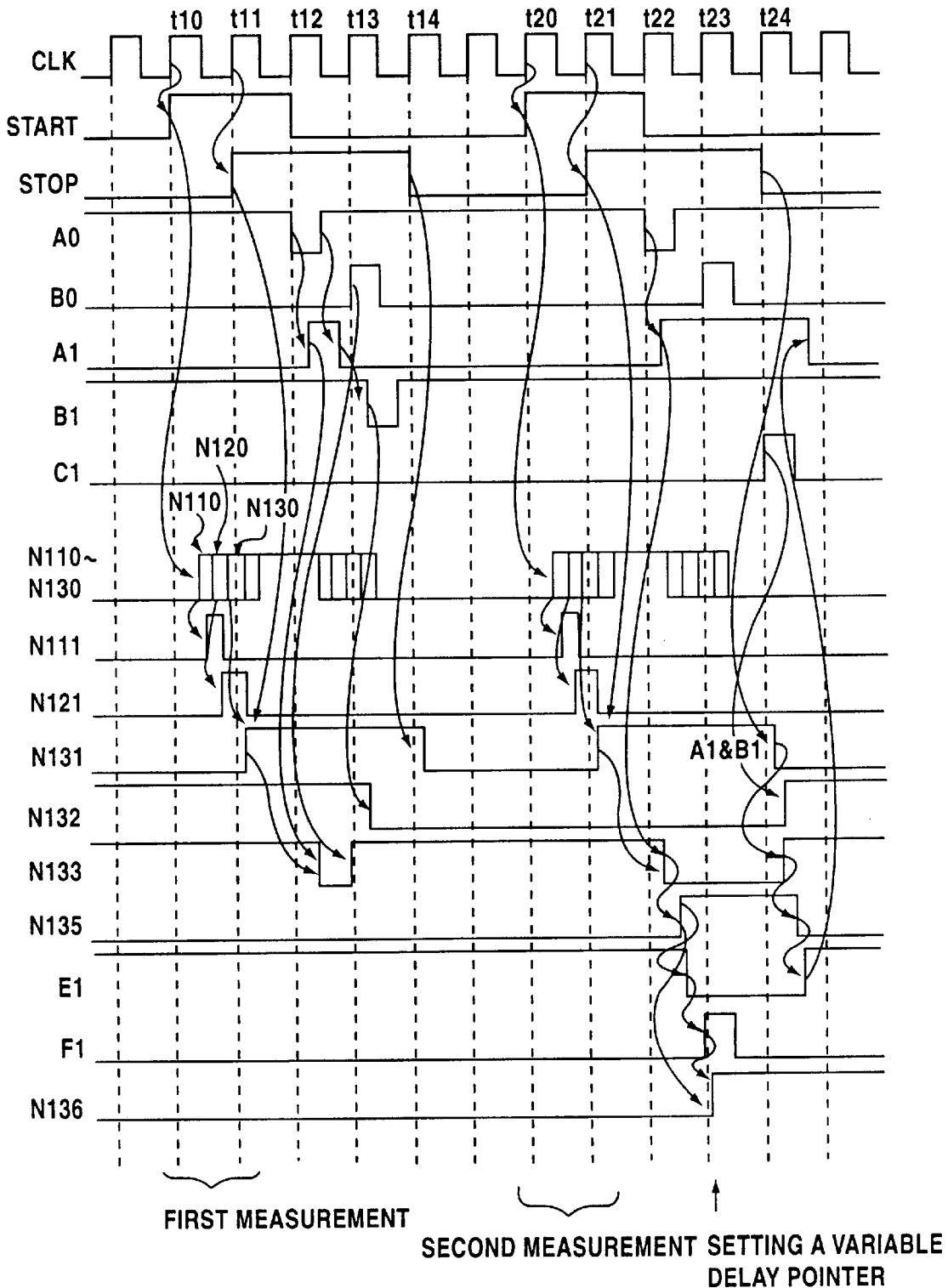
FIG. 6 is a timing chart when the second measured result is coincident with the first one in the circuit in FIG. 2.

FIG. 6 illustrates an operational timing chart when the second result is coincident with the first result in the circuit shown in FIG. 5. As the stop pulse STOP is level L in the condition before a clock cycle is measured at first, all of transfer gates in the gate section 122 become conductive. Then, control pulses A0 and B0 respectively become levels H and L. The pulse A1 is at level L, and the NAND gates 101, 103, 105, 109 respectively closes. Further, the pulse B1 is level H, the P channel transistors 102, 104, 106, 110 become non-conductive. Further, all of the nodes N112–N1m2 in the latch circuit of the delay measured result latching section 126 are reset to be at level H, all of the nodes N114–N1m4 are at level L, and all of the P channel transistors 142, 144, 146, 150 become conductive.

The DLL controller 11 supplies a start pulse START in synchronism with the rise timing of a clock CLK at a timing t10 of FIG. 6. In this example, a start pulse START has a pulse width required for two cycles of the clock CLK. This start pulse START passes through a basic delay circuit 20 in the delay measurement circuit 121 and makes each nodes N110 to N1m0 level H, subsequently. Then, as all elements in the gate section 122 are conductive, level H of the node N110 is latched by the latch circuits 41, 42 of the latching section 123, and level L is supplied to the NOR gate 52. At the time, the Node N120 is still at level L. Therefore, an output from the invertor 51 becomes level L, and the level L is supplied to the NOR gate 52. The other input from the NOR gate 52 is at level L, and the node N111 is temporally at level H. However, when the start pulse START is propagated to the node N120, the node N120 becomes level H, and the level H is latched by the latch circuit 43, 44. As the result, the output of the inverter 51 becomes level H so that the node N111 returns to level L. In other words, a H pulse having a pulse width required for propagating the delay time of the NAND gate 23 and the inverter 24 is generated in the node N111. A H pulse having a short pulse width is generated at the subsequent node N121, similarly.

At a timing t11 of the subsequent rise of the clock CLK, the DLL controller 11 supplies the stop pulse STOP. All of the transfer gates in the gate section 122 close according to the level H of stop pulse STOP. In the example of FIG. 6, when the start pulse START propagates to the node N130, the stop pulse STOP is generated. Then, the next node N140 is at level L, and therefore, the output from the invertor 55 is at level L, the output from the invertor 46 is also at level L, and only the output N131 from the NAND gate 56 becomes level H. The interval at level H at the output N131 continues until the stop pulse STOP becomes level L and the gate 122 opens.

As described above, one of the nodes N111 to N1m1 becomes level H according to the length of a clock cycle of the reference clock CLK. It is possible to generate the delay time D14 which is the same as that of the variable delay circuit 14 in the gates 21–30 by suitably selecting a delay time of the basic delay circuit 20.

Next, the control pulse A0 at level L is supplied in synchronism with a timing t12. As the coincidence judging signal E1 is level H at first, the output A1 from the NAND gate 110 becomes level H. As a result, each NAND gates 101, 103, 105, . . . , 109 in the switch section 125 open, the signal of the node N111–N1m1 is inverted and supplied to the nodes N112–N1m3. As described in FIG. 6, only the node N133 becomes level L. Then, the NOR gate 127-3 judges whether or not each node N133 to N1m3 is coincident with each nodes N112 to N1m2 latched in the delay measured result latching section 126. At first measurement, all of the nodes N112 to 1m2 in the latching section 126 are level H. This means that all of the nodes N112 to N1m2 are not coincident with the node N133 at level L. Therefore, all of the outputs N115–N1m5 in the NOR gate 127 become level L.

As the coincidence judging signal E1 does not become level L in response to the coincidence judging pulse A0, the DLL controller 11 generates a pulse B0 at level H for latching the delay measured result at a timing t13. In response to that, the NAND gate 111 generates a control pulse B1 at level L to make P channel transistors 102, 104, 106, . . . , 110 conductive. As a result, the delay measured results of the nodes N111–N1m1 are latched to each latching circuits in the delay measured result latching section 126. In this example, only the node N132 latches level L, the other nodes N112, N122 . . . N1m2 are in the latched status of level H. The inverter 145 makes the node N134 level H and makes the P channel transistor 146 non-conductive in response to the latched node N132 at level L. As a result, the measured results after that are not taken in the latch circuit 135 and 136.

At a timing t14, the stop pulse STOP is risen to make the gate section 122 conductive in all and return the node N131 to level L. The first clock cycle measurement is finished here.

A second clock cycle measurement is started by the start pulse START in synchronism with a timing t20. When the stop pulse STOP is risen to level H at a timing t21, all gates in the gate section 122 close. In the example of FIG. 6, the start pulse START is achieved to the node N130 at the second measurement again. Therefore, only the node N131 becomes level H and the other nodes N111, N121, . . . , N1m1 become level L, similarly to the first clock cycle measurement.

Then, the DLL controller 11 generates a coincidence judging pulse A0 to open all of NAND gates 101, 103, 105, . . . 109 in the switch section 125 in response to level H of the pulse A1. The NOR gate 127 judges whether or not the inverse signal of the delay measured result signal of the node N111–N1m1 is coincident with the latch signal of the node N112–N1m2 in the latching section 126 at level L. Then, the node N133 becomes level L and the node N132 to which the first measured result is latched is also level L. Therefore, the output N135 of the NOR gate 127-3 becomes level H. That is, it is judged that the currently-measured result is coincident with the previously measured results.

The N channel transistor 75 becomes conductive in response to level H of the node N135, the node E0 is fallen down to level L, and the coincidence judging signal E1 is made to level L. The NAND gates 110, 111 concurrently fix both of outputs A1 and B1 to level H, i.e., the coincidence judging status is fixed. On the other hand, the inverter 164 and NOR gate 163 generate a gate pulse F1 (GATE) having a pulse width for a delay time of the inverter 164 in response to level L of the coincidence judging signal E1. All gates in the transfer gate 128 become conductive in response to the level of F1, the node N135 at level H and the other nodes N115, N125, . . . , N1m5 at level L are latched to the variable delay pointer 13 (128). As a result, the delay control signal 15 according to the delay measured result coincident, at least, in the first and second measurements is output from the node N116–N1m6 to the variable delay circuit 14.

The coincidence judging signal E1 is also supplied to the DLL controller 11. The DLL controller 11 supplies a reset pulse C1 at a timing t24 in response to that signal. The transistors 151–159 become conductive in response to level H of the reset pulse C1, and the nodes N112–N1m2 are reset to L level. Additionally, the node N135 becomes L level in response to the resetting, and the coincidence judging signal E1 returns to level H, and therefore, a fixed status at level H of the pulses A1 and B1 is cleared.

Figure 7:
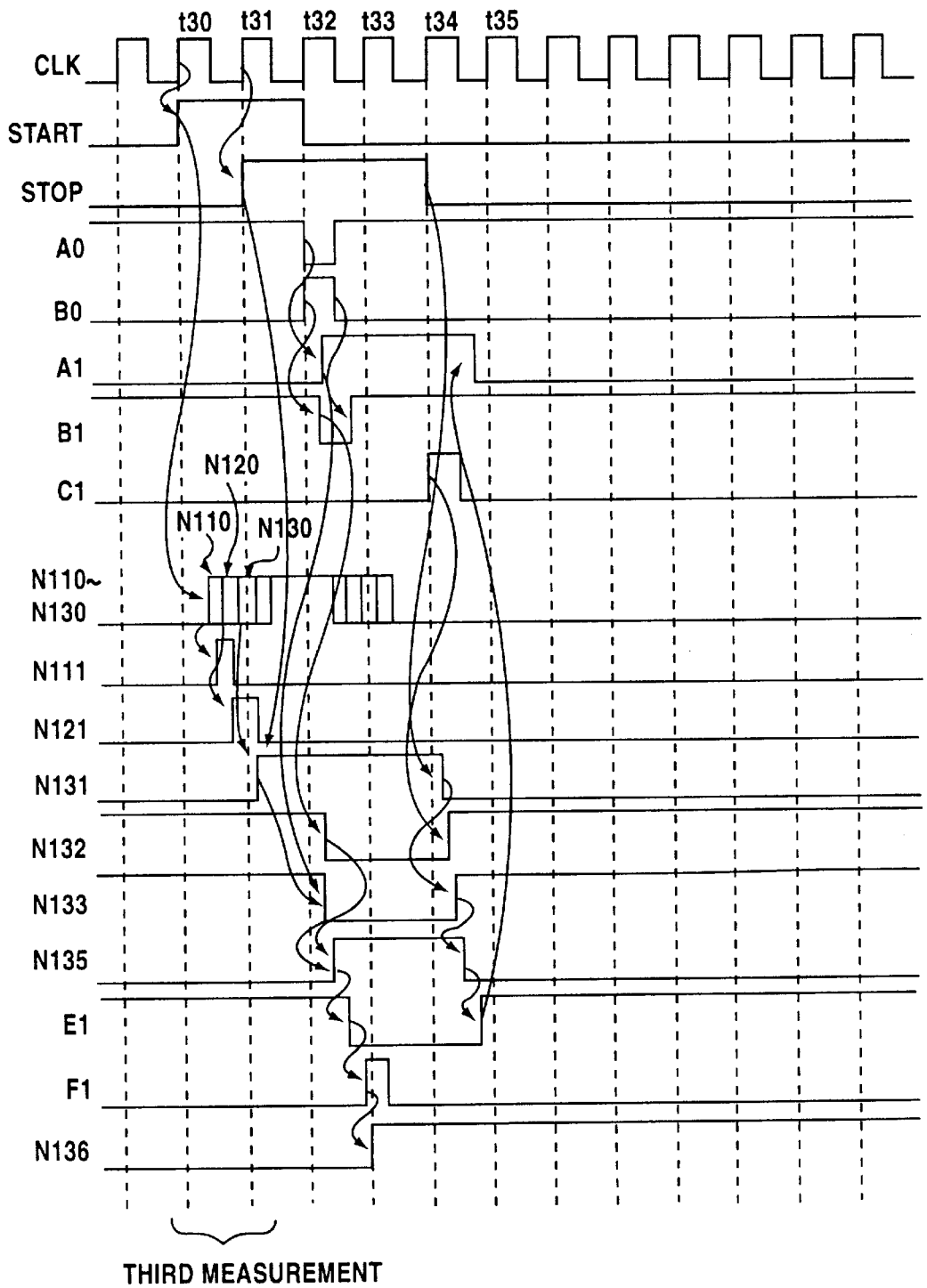
FIG. 7 is a timing chart on the third (=Lth) measurement when the previous measured results are not coincident in the circuit in FIG. 5.

FIG. 7 is an operational timing chart for third measurement in the circuit shown in FIG. 5 in a case where a limited time L for measurement is 3 and measurement results are not coincident on the first and second measurements. In this example, a delay control signal is generated according to the third measurement result.

A third measurement is also started by a start pulse START at a timing t30. Then, the gate section 122 closes according to the stop pulse STOP at a timing t31. This example will be also explained when the start pulse START is propagated until achieving to the gate N130. The gate section 122 closes in response to the stop pulse STOP, and only the node N131 becomes level H.

Since there is no coincident judgment in the DLL controller 11, pulses A0 and B0 are concurrently generated at a timing t32 on the last third measurement. This is a different point from the operation described in FIG. 6. The node N131 at H level inverts each levels of the nodes N133 and N132 to level L in response to the concurrently generation of these control pulses A0 and B0. Then, the output N135 of the NOR gate 127-3 is level H. Operations after that are the same as those of the above-described coincidence judgment.

The pulses A1 and B1 are fixed according to level L of the signal E1. The level H of the node N135 and level L of the other nodes are latched to the variable delay pointer 13 as a delay control signal 15 according to the generated gate pulse F1. After that, the pulses are reset to the first status according to the reset pulse C1. However, a variable delay pointer 13 continues latching the delay control signal 15.

Figure 8:
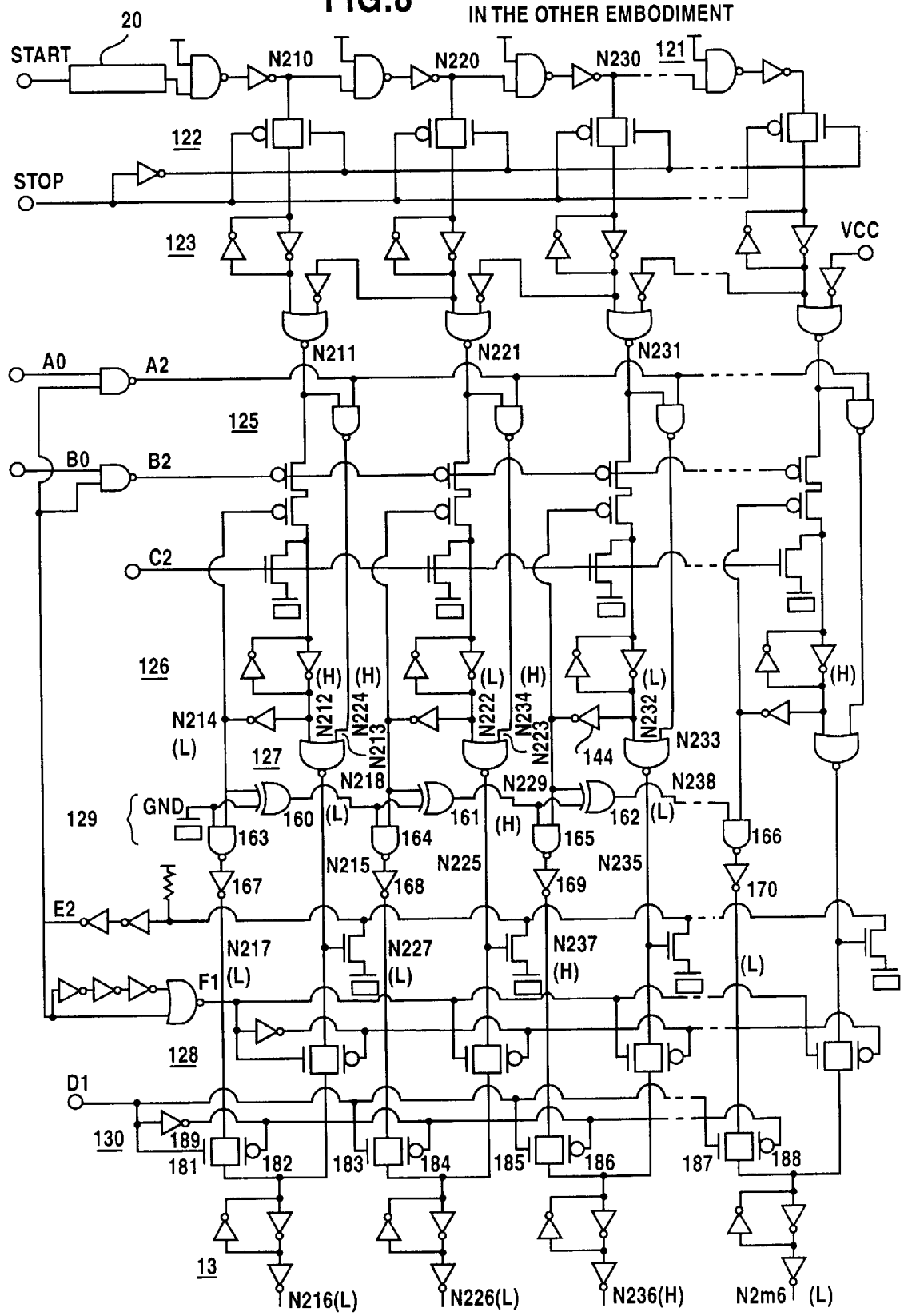
FIG. 8 is a detailed circuit of a clock cycle measurement section and a variable delay pointer 13 according to the other embodiment.

FIG. 8 shows a detailed circuitry diagram of a clock cycle measurement section 12 and a variable delay pointer 13 according to the other embodiment. This circuitry diagram is different from that shown in FIG. 5 because a selector 129 and a gate section 130 are added. To distinguish from the case shown in FIG. 5, first figures of reference numbers of each nodes are changed to 2. However, the second and third figures are the same as those shown in FIG. 5. One part of reference numbers identifying the same sections of FIG. 5 are omitted.

In the other embodiment shown in FIG. 8, these elements include a delay measurement circuit 121, a gate section 122, a delay status latching section 123, a switch section 125, a delay measured result latching section 126, a coincidence judging circuit 127 and a gate section 128.

In the above described circuitry diagrams of FIGS. 3 and 5, when the measured result is not coincident until finishing the maximum times for measuring the clock cycle, a delay control signal according to the last measured result is latched to the variable delay pointer 13. In the example of FIG. 8, if two measured results are coincident, a delay control signal corresponding to the coincident measured result is latched, similarly to those of the examples shown in FIGS. 3 and 5. However, if the result is not coincident until coming to the last measurement, a delay control signal according to the intermediate measured value from the previously measured results is latched. Therefore, it becomes possible to suppress errors caused by noises to the minimum.

Figure 9:
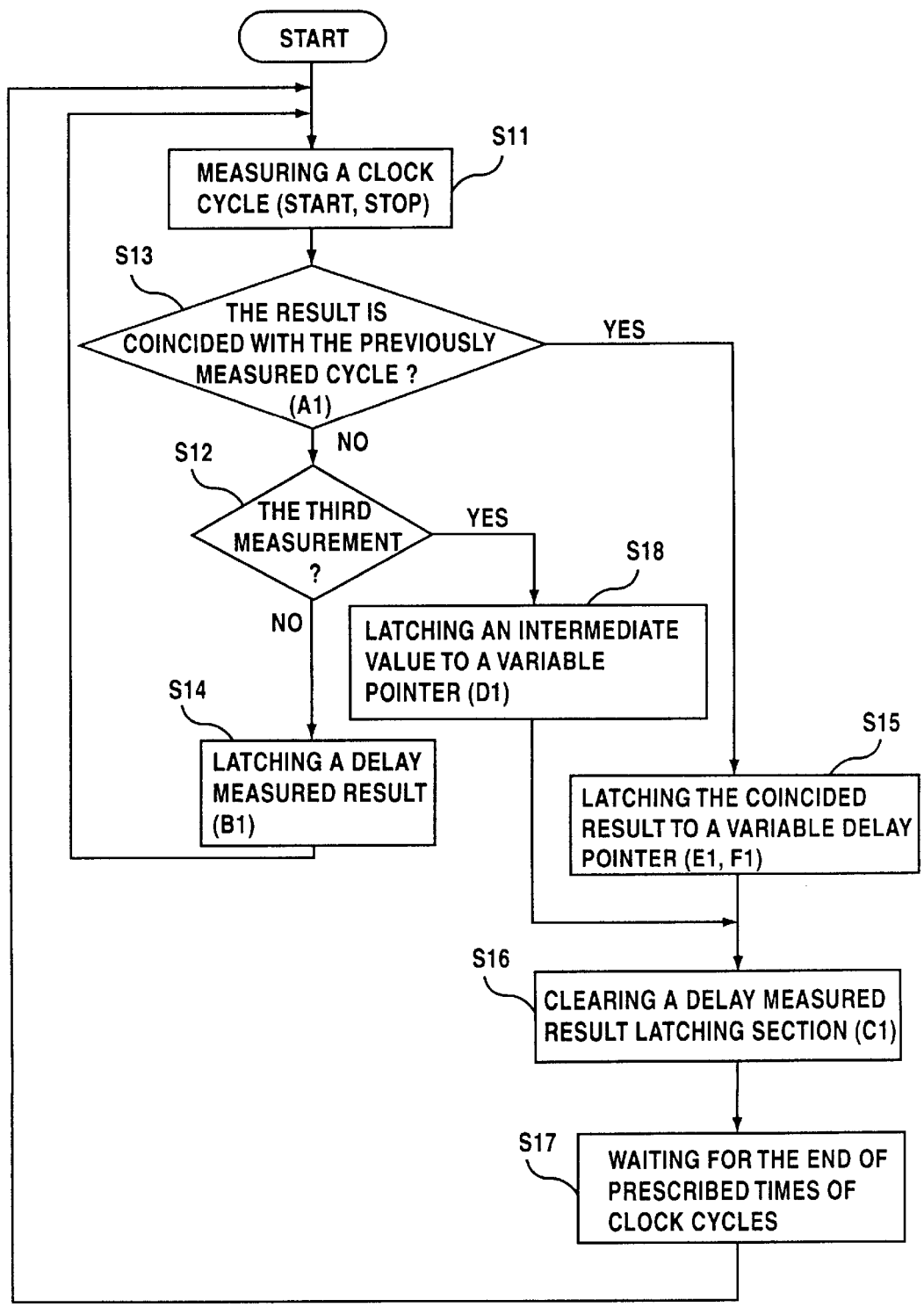
FIG. 9 is an operational flow chart of the circuit of FIG. 8.

FIG. 9 shows an operational flow chart of a DLL circuit according to the embodiment shown in FIG. 8. In comparison with the flow chart shown in FIG. 4, a coincidence judging section 127 judges whether or not the result are coincident with the previously measured results until coming to the third measurement (S13). A delay control signal according to the intermediate measured value from three of the previously measured results is latched to the variable delay pointer 13 when the results are not coincident at third measurement (S12, S18). Other operations are the same as those of FIG. 4.

Figure 10:
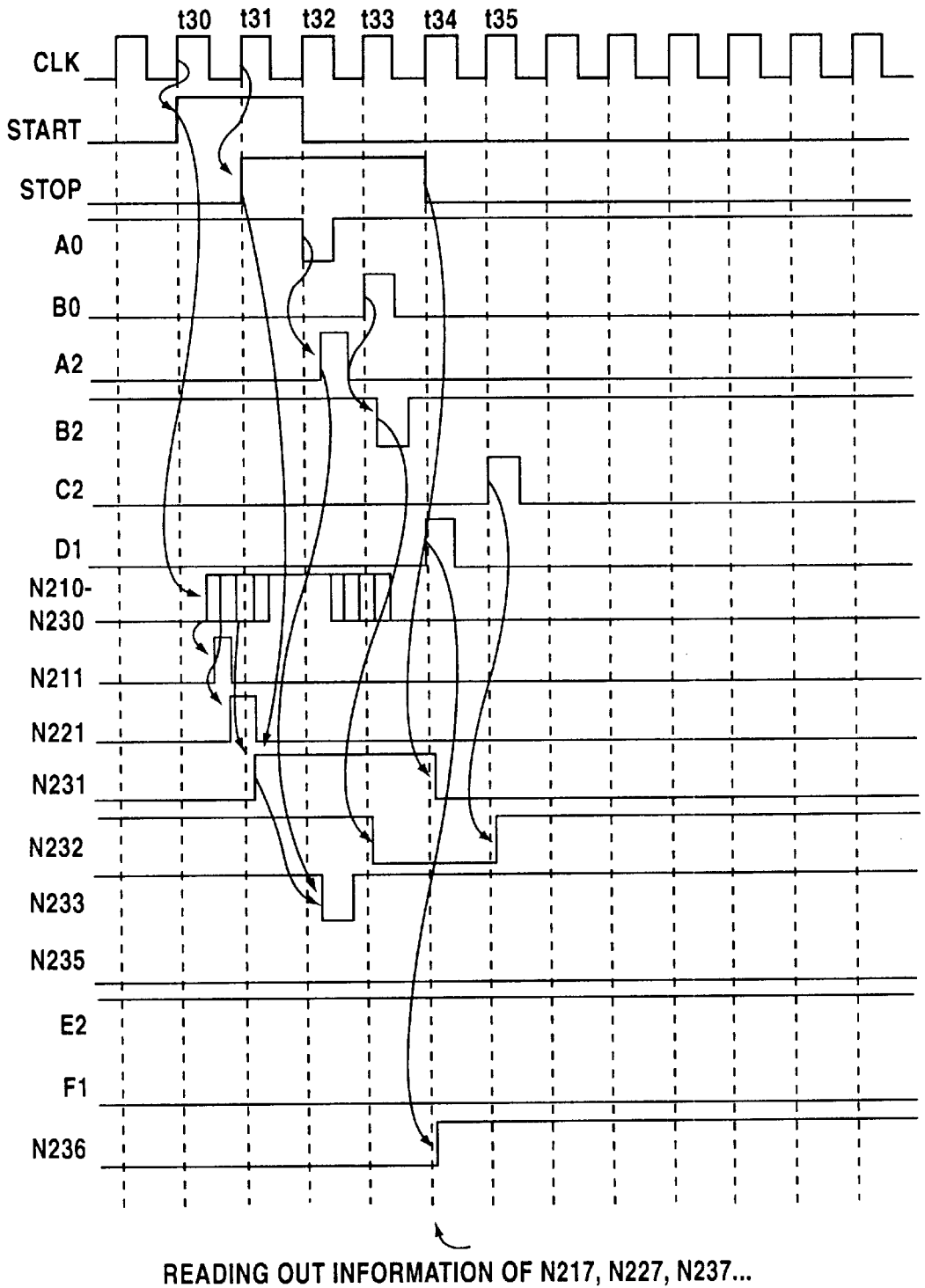
FIG. 10 is an operational timing chart on the third measurement when the measured results are not coincident through three measurements.

FIG. 10 is an operational timing chart on the third measurement when the results are not coincident on three measurements in the circuit of FIG. 8. In the circuit of FIG. 8, as described above, a coincidence judging circuit 127 judges whether or not the results are coincident with the previously measured results until coming to the last third measurement, similarly to those in the circuits in FIGS. 3 and 5. However, in the example of FIG. 10, it is assumed that the measured result where the node N221 is at level H on the first measurement and some node positioned on the right side of the node N231 at level H on the second measurement, both results are latched to the corresponding delay measured result latching section 126, and the result where the node N231 is at level H on the third measurement is latched to the latching section 126. Therefore, (H) and (L) in FIG. 8 are showing each statuses in nodes when the third measured result is latched.

EOR gates 160, 161, 162 . . . in a selector 129 output level L when the inputs are coincident and output level H when the inputs are not coincident. Then, one input of the EOR gate 160 is at level L, which is a grand level. Therefore, the outputs of the EOR gates on the right to the output from the EOR gate 161 become level H, according to level L of the node N222 latched when detecting a shortest clock cycle on the previous two measurements. Further, the outputs of the EOR gates on the right side of the output of the EOR gate (right to 162) become level L, according to level L of the node N2n2, i.e., the right section of the node N232.

The variable delay pointer 13 latches a delay control signal according to the intermediate clock cycle from the three measurements by employing the selector 129. Returning to FIG. 10, the third measurement is started by the start pulse START generated at a timing t30. Then, the gate section 122 closes according to the stop pulse STOP generated at a timing t31, and level H of the node N231 is generated.

After that, the control pulse A0 is generated at a timing t32 as usual, and the node N233 becomes level L in response to a pulse A2. In this case, the result is not coincident with the previously two measured results, and then, a coincidence judging signal E2 is still level H. Next, a control pulse B0 is generated at a timing t33, level H of the node N231 is latched to the latching section 126, and the node N232 becomes level L. The inverter 144 makes the node N234 level H in response to level H of the node N231, and the EOR gate 162 make the output N238 level L.

The output N229 of the EOR gate 161 also becomes level H according to level L of the node N222, the output of the NAND gate 165 becomes level L and the output N237 of the invertor 169 becomes level H in response to the level H of the node N234. The other inverters 167, 167 and 170 in the selector 129 respectively output level L.

In this way, it is judged from the coincidence judging signal E2 that the results are not coincident at the third measurement. Therefore, the DLL controller 11 generates a control pulse D1 and makes the transfer gates 181 to 188 in a gate section 130 conductive. Thereby, the level H of the node N237 is latched to the variable delay pointer 13 as a delay control signal 15. That is, the node N236 becomes level H, and the other nodes N216, 226, 2m6 respectively become level L.

As described above, it is possible to generate a delay control signal 15 corresponding to the intermediate clock cycle after three measurements and latch it to the variable delay pointer 13.

FIG. 11 is a detailed circuitry diagram showing one example of a variable delay circuit 14 illustrated in FIG. 1. Their delay time are selected by means of delay control signals N116 to N1m6. These variable delay circuits receive an internal clock CLK0 via an input terminal IN, delay it for a prescribed time period, and then output it the output terminal OUT. In this example, there m stages of delay circuits: the first stage comprises NAND gates 711, 712 and an inverter 713, the second stage comprises NAND gates 721, 722, and an inverter 723, and the subsequent stages are constructed similarly, up to the mth stage, which comprises NAND gates 761, 762 and the inverter 763.

As described above, one of the delay control signals N116 to N1m6 takes a level H, and all the others takes a level L. The one NAND 711, 721, . . . , 761 corresponding to the delay control signal N116, N126, . . . , N1m6 at level H is opened by this signal and the internal clock CLK0 supplied to its input IN is allowed to pass. The other NANDS 711, 721, . . . , 761 corresponding to the other delay control signals N116, N126, . . . ,N1m6 at level L are all closed by these signals. As shown in the diagram, NAND 711 opens when the delay control signal N116 is at level H, and a delay path is formed from the input terminal IN to the output terminal OUT, via the inverter 701, NANDs 711, 712, and inverter 713. Therefore, a delay of four gate stages is obtained.

When the delay control signal N126 is at level H, NAND 762 opens. Since both inputs to gate 762 are at level H, the output of inverter 763 is level H and similarly, the outputs of inverters 753, 743, . . . are also level H. Therefore, NAND 722 will also be in an opened state. As a result, a delay path is formed from the input terminal IN to the output terminal OUT via inverter 701 and gates 721 to 723, and 712, 713. Accordingly, a delay of six gate stages is obtained. As shown in FIG. 11, each time the delay control signal N116, N126, . . . , N1m6 at level H moves to the left, the number of gates in the delay path increases by two. When the delay control signal N1m6 is at level H, the delay comprises 2+2n gate stages. Therefore, the variable delay circuit shown in FIG. 11 can generate a delay time D14 according to a length of a measured clock cycle according to a delay control signal based on the delay result measured by the above-described clock cycle measurement section 12.

As described above, according to the present invention, it is possible to provide a DLL circuit which can measure a clock cycle precisely for a short time and generate a delay control signal based on the clock cycle.

What is claimed is:

1. A DLL circuit which generates a second clock in synchronism with a first clock, maintaining a prescribed phase relationship therebetween, said DLL circuit comprising:
 a clock cycle measurement section which measures a clock cycle of the first clock and generates a delay control signal according to the measured cycle, and
 a variable delay circuit which receives the first clock and outputs the second clock after an elapse of a delay time controlled by the delay control signal,
wherein the clock cycle measurement section measures a clock cycle of the first clock plural times and generates the delay control signal according to the coincident result while plural measurements.

2. The DLL circuit according to claim 1,
wherein said clock cycle measurement section further comprises:
 a variable delay pointer section which maintains the delay control signal generated by the clock cycle measurement section.

3. The DLL circuit according to claim 1,
wherein said clock cycle measurement section comprises:
 a delay measurement circuit to which a start pulse in synchronism with a timing of starting the first clock is supplied;
 a delay status latching section which latches a delay status of the delay measurement circuit in response to an end pulse in synchronism with a timing of finishing the first clock;
 a delay measured result latching section which maintains the delay measured result latched by the delay status latching section, and
 a coincidence judging section which judges whether or not the delay measured result stored in the delay measured result latching section is coincident with the currently measured delay measured result,
wherein the delay control signal is generated according to the coincidence obtained in the coincidence judging section.

4. The DLL circuit according to claim 1 or 3,
wherein the clock cycle measurement section generates the delay control signal according to the last measured result in the plural measurements when the results are not coincident.

5. The DLL circuit according to claim 1 or 3,
wherein the clock cycle measurement section generates the delay control signal according to the intermediate result selected from the measured results when the results are not coincident while the plural measurements.

6. A memory device which outputs data in synchronism with a first clock having a prescribed phase relationship thereto, said memory device comprising:

a memory cell array for storing the data;

an output buffer for outputting the data read from the memory cell array; and a DLL circuit which generates an output clock for controlling an output timing of the output buffer from the first clock, wherein said DLL circuit comprises:

a clock cycle measurement section which measures a clock cycle of the first clock and generates a delay control signal according to the measured cycle; and a variable delay circuit which inputs the first clock and outputs the second clock after an elapse of a delay time controlled by the delay control signal, and said clock cycle measurement section measures a clock cycle of the first clock predetermined plural times and generates the delay control signal according to the coincident result while the plural measurements.

* * * * *